United States Patent
Pan et al.

(10) Patent No.: US 11,824,441 B2
(45) Date of Patent: *Nov. 21, 2023

(54) MULTI-MODE VOLTAGE PUMP AND CONTROL

(71) Applicant: MICRON TECHNOLOGY, INC., Boise, ID (US)

(72) Inventors: Dong Pan, Boise, ID (US); Beau D. Barry, Boise, ID (US); Liang Liu, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/840,434

(22) Filed: Jun. 14, 2022

(65) Prior Publication Data

US 2022/0311335 A1    Sep. 29, 2022

Related U.S. Application Data

(63) Continuation of application No. 16/321,769, filed as application No. PCT/CN2018/119102 on Dec. 4, 2018, now Pat. No. 11,374,488.

(51) Int. Cl.
*G05F 1/10* (2006.01)
*G05F 3/02* (2006.01)
(Continued)

(52) U.S. Cl.
CPC ............. *H02M 3/07* (2013.01); *G11C 5/145* (2013.01); *G11C 17/18* (2013.01); *H03K 19/20* (2013.01); *G11C 11/4074* (2013.01)

(58) Field of Classification Search
CPC .. H02M 3/073; H02M 3/07; H02M 2003/077; G11C 5/145; G05F 3/205
(Continued)

(56) References Cited

U.S. PATENT DOCUMENTS 7,808,324 B1    10/2010    Woodford et al.
7,956,673 B2    6/2011    Pan
(Continued)

FOREIGN PATENT DOCUMENTS

CN    102820063 A    12/2012
CN    104036811 A    9/2014
(Continued)

OTHER PUBLICATIONS

International Search Report and Written Opinion for PCT Application No. PCT/CN2018/119102, dated Sep. 11, 2019.
(Continued)

*Primary Examiner* — Quan Tra
(74) *Attorney, Agent, or Firm* — Dorsey & Whitney LLP (57) ABSTRACT

A multi-mode voltage pump may be configured to select an operational mode based on a temperature of a semiconductor device. The selected mode for a range of temperature values may be determined based on process variations and operational differences caused by temperature changes. The different selected modes of operation of the multi-mode voltage pump may provide pumped voltage having different voltage magnitudes. For example, the multi-mode voltage pump may operate in a first mode that uses two stages to provide a first VPP voltage, a second mode that uses a single stage to provide a second VPP voltage, or a third mode that uses a mixture of a single stage and two stages to provide a third VPP voltage. The third VPP voltage may be between the first and second VPP voltages, with the first VPP voltage having the greatest magnitude. Control signal timing of circuitry of the multi-mode voltage pump may be based on an oscillator signal.

18 Claims, 8 Drawing Sheets

(51) Int. Cl.
  *H02M 3/07* (2006.01)
  *G11C 5/14* (2006.01)
  *G11C 17/18* (2006.01)
  *H03K 19/20* (2006.01)
  *G11C 11/4074* (2006.01)

(58) Field of Classification Search
  USPC .......................................................... 327/536
  See application file for complete search history.

(56) References Cited

U.S. PATENT DOCUMENTS

| | | | | |
|---|---|---|---|---|
| 8,193,853 | B2* | 6/2012 | Hsieh | H02M 3/07 |
| | | | | 363/60 |
| 8,896,367 | B1* | 11/2014 | Lin | H02M 3/073 |
| | | | | 363/60 |
| 10,680,517 | B1* | 6/2020 | Qiao | G11C 16/30 |
| 2002/0130701 | A1 | 9/2002 | Kleveland | |
| 2006/0170486 | A1* | 8/2006 | Tranchina | A61N 1/025 |
| | | | | 327/536 |
| 2006/0250177 | A1* | 11/2006 | Thorp | H02M 3/073 |
| | | | | 327/536 |
| 2007/0205823 | A1 | 9/2007 | Cho | |
| 2008/0018377 | A1 | 1/2008 | Chung | |
| 2009/0016085 | A1 | 1/2009 | Rader et al. | |
| 2011/0221514 | A1 | 9/2011 | Pan | |
| 2013/0051159 | A1 | 2/2013 | Ryu | |

FOREIGN PATENT DOCUMENTS

| | | |
|---|---|---|
| CN | 107358976 A | 11/2017 |
| CN | 107919144 A | 4/2018 |
| WO | 2010033880 A2 | 3/2010 |

OTHER PUBLICATIONS

European Extended Search Report dated Jul. 12, 2022 for EP Application No. 18942104.3.

* cited by examiner

MULTI-MODE VOLTAGE PUMP AND CONTROL

CROSS REFERENCE TO RELATED APPLICATIONS

This application is a continuation of U.S. application Ser. No. 16/321,769, filed Jan. 29, 2019, which is a 35 U.S.C. § 371 National Stage Application of PCT Application No. PCT/CN2018/119102, filed Dec. 4, 2018. The entire contents of these applications are hereby incorporated by reference, in their entirety, for any purposes.

BACKGROUND

High data reliability, high speed of memory access, low power, and reduced chip size are features that are demanded from semiconductor memory. In some applications, circuits may use supply voltages having potential greater than that provided by an external voltage source. For example, some memory circuits may use higher internal voltages to activate access lines during a memory access operation. Voltage pump circuits may be included to generate the higher internal voltages. A difference between external voltage supply magnitudes and the higher internal voltage magnitudes used during operation may vary from application to application. In addition, efficiency of a voltage pump circuit may vary based on process and temperature differences. Thus, voltage pump circuits may be designed to provide sufficient margin to account for process, voltage, and temperature variation in order to meet operational voltage requirements. However, designing voltage pump circuits to operate assuming worst case scenarios may result in wasted power consumption in some applications.

DETAILED DESCRIPTION OF THE EMBODIMENTS

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
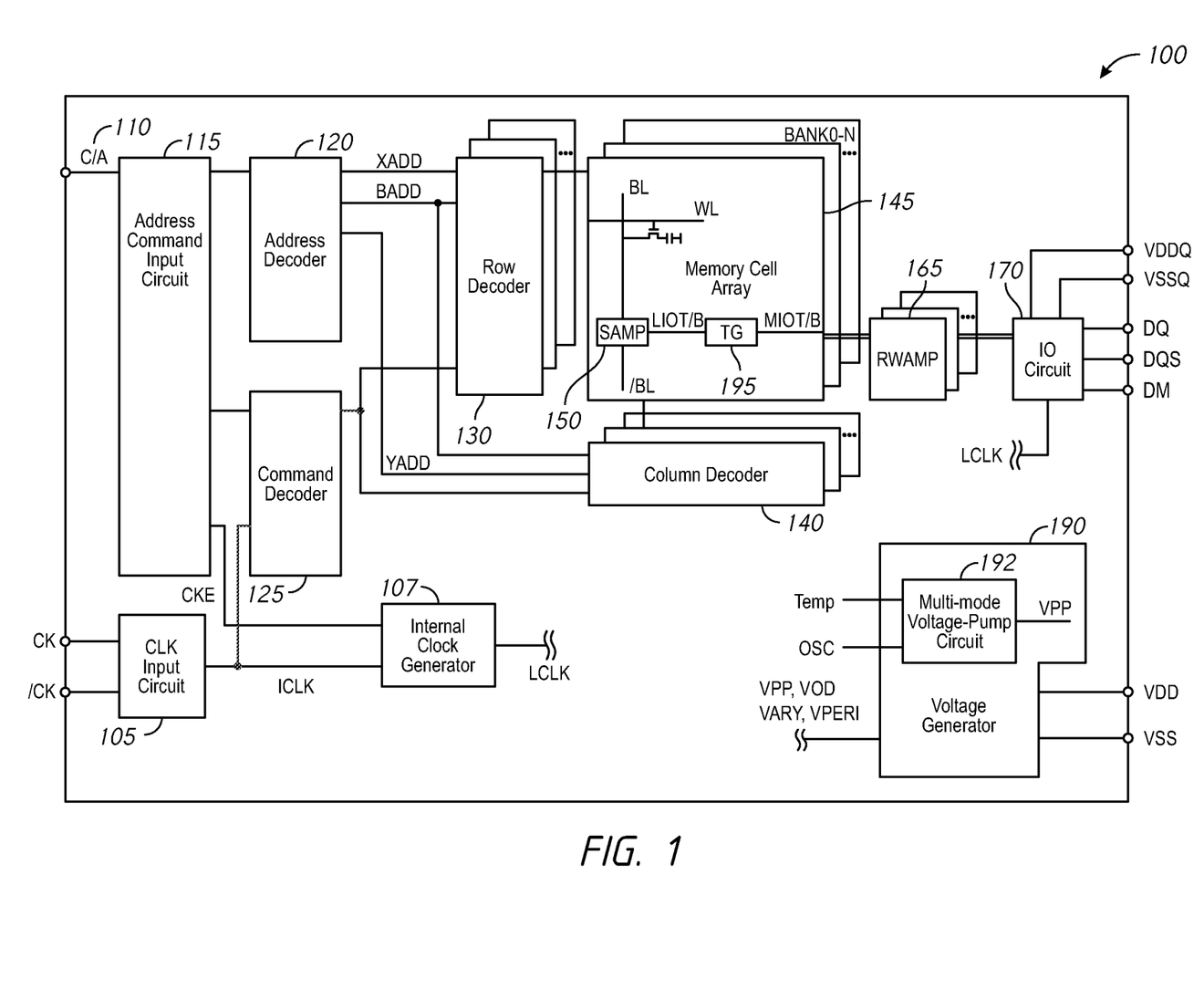
FIG. 1 is a schematic block diagram of a semiconductor device, in accordance with an embodiment of the present disclosure.

FIG. 1 is a schematic block diagram of a semiconductor device 100 as a memory device, in accordance with an embodiment of the present disclosure. The semiconductor device 100 may include a clock input circuit 105, an internal clock generator 107, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator circuit 190. The semiconductor device 100 may include a plurality of external terminals including address and command terminals coupled to command/address bus (C/A) 110, clock terminals CK and /CK, data terminals DQ, DQS, and DM, and power supply terminals VDD, VSS, VDDQ, and VSSQ. The terminals and signal lines associated with the command/address bus 110 may include a first set of terminals and signal lines that are configured to receive the command signals and a separate, second set of terminals and signal lines that configured to receive the address signals, in some examples. In other examples, the terminals and signal lines associated with the command and address bus 110 may include common terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of bit lines BL, and a plurality of memory cells MC arranged at intersections of the plurality of word lines WL and the plurality of bit lines BL. The selection of the word line WL for each bank BANK0-N is performed by a corresponding row decoder 130 and the selection of the bit line BL is performed by a corresponding column decoder 140. The plurality of sense amplifiers 150 may be located for their corresponding bit lines BL and coupled to respective local I/O line pairs (LIOT/B) further coupled to respective main I/O line pairs (MIOT/B), via transfer gates TG 195, which function as switches. The sense amplifiers 150 and transfer gates TG 195 may be operated based on control signals from decoder circuitry, which may include the command decoder 125, the row decoders 130, the column decoders 140, any control circuitry of the memory cell array 145 of the banks BANK0-N, or any combination thereof.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller, at the command/address terminals via the command/address bus 110 and provide the command signal to the command decoder 125. The command decoder 125 may decode the command signal and generate various internal command signals. For example, the internal command signals may include a row command signal to select a word line, or a column command signal, such as a read command or a write command, to select a bit line.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ together with a read data strobe signal at DQS. Similarly, when the write command is issued and a row address and a column address are timely supplied with the write command, and then the input/output circuit 170 may receive write data at the data terminals DQ together with a write data strobe signal at DQS and a data mask signal at DM and provide the write data via the read/write amplifiers 165 to the memory cell array 145. Thus, the write data may be written in the memory cell designated by the row address and the column address.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data. In addition to the phase controller internal clock signal LCLK, the internal clock generator may generate various internal clock signals for memory operations.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

In some examples, the voltage generator circuit 190 includes a multi-mode voltage pump 192 that is configured to provide the VPP voltage. The VPP may be a pumped voltage that is greater than the external supply voltage VDD. The multi-mode voltage pump 192 may be a multi-stage voltage pump circuit that is configured to operate in different modes based on a temperature. In some examples, the multi-mode voltage pump 192 may be capable of operating in one of at least three different modes, including a single stage mode, a two stage mode, and a mixed stage mode. The multi-mode voltage pump 192 may be configured to select an operational mode based on a temperature of the semiconductor device received via a temperature signal Temp. In some embodiments, the temp signal may indicate a temperature measurement. In other examples, the temp signal may indicate a temperature range (e.g., high, medium, low, etc.). The selected mode for a range of temperature values may be determined during production, as each semiconductor device may experience differences in the VDD voltage magnitude and the VPP voltage requirements, as well as process variations during fabrication and operational differences caused by temperature changes. Thus, the temperature range to selected mode programming may be determined during production testing of the semiconductor device. The temperature range to selected mode programming may be programmed in a programmable element bank (e.g., fuse or anti-fuse bank circuit), in some examples. In some examples, a mode may be programmed for each temperature range. For example, a first selected mode may be programmed for a first temperature range (e.g., low), a second selected mode may be programmed for a second temperature range (e.g., medium), a third selected mode may be programmed for a third temperature range (e.g., high). Additional temperature ranges may be defined without departing from the scope of the disclosure. In some examples, a same mode may be programmed for more than one temperature range, or for all temperature ranges. The different selected modes of operation of the multi-mode voltage pump 192 may provide a VPP voltage having different voltage magnitudes. For example, the multi-mode voltage pump 192 may operate in a first mode that uses two stages to provide a first VPP voltage, the multi-mode voltage pump 192 may operate in a second mode that uses a single stage to provide a second VPP voltage, and the multi-mode voltage pump 192 may operate in a third mode that uses a mixture of a single stage and two stages to provide a third VPP voltage. The third VPP voltage may be between the first and second VPP voltages, with the first VPP voltage having the greatest magnitude. Control signal timing of circuitry of the multi-mode voltage pump 192 may be based on an oscillator signal OSC (e.g., provided from an oscillator circuit, such as an oscillator circuit included in the clock input circuit 105).

Figure 2:
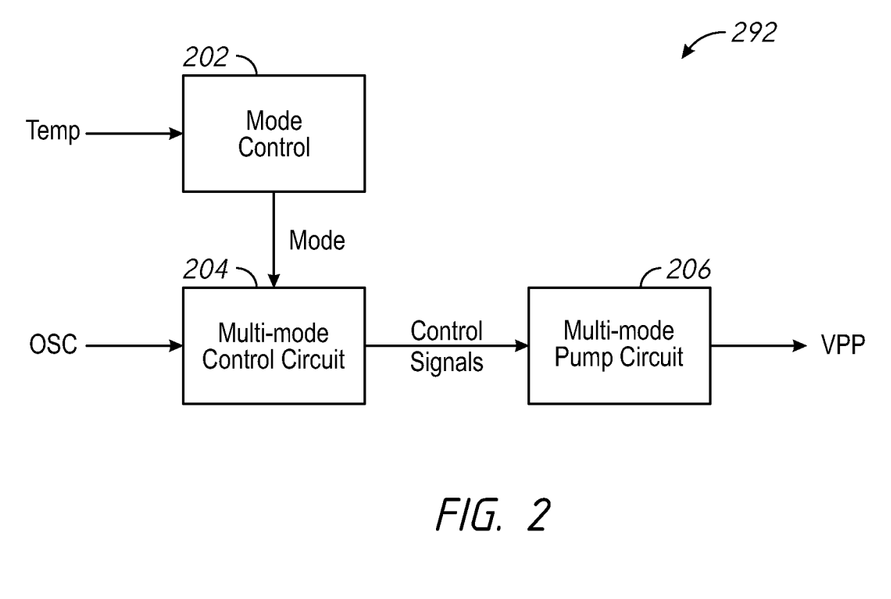
FIG. 2 is a block diagram of a multi-mode voltage pump in accordance with an embodiment of the present disclosure.

FIG. 2 is a block diagram of a multi-mode voltage pump 292 in accordance with an embodiment of the present disclosure. The multi-mode voltage pump 292 may include a mode control circuit 202, a multi-mode control circuit 204, and a multi-mode pump circuit 206. The multi-mode voltage pump 292 may be included in the multi-mode voltage pump 192 of FIG. 1, in some examples.

The mode control circuit 202 may be configured to receive a temperature signal Temp and to provide a mode control signal Mode to the multi-mode control circuit 204. In some embodiments, the temp signal may indicate a temperature measurement. In this example, the mode control circuit 202 may include logic to convert the temp signal value to a range value that indicates one of a predefined set of temperature ranges (e.g., low, medium, high). For example, if the temperature is less than or equal to a first (e.g., low) temperature threshold, the mode control circuit 202 set the range value to "low". If the temperature is greater than the first (e.g., low) temperature threshold and less than or equal to a second (e.g., high) temperature threshold, the mode control circuit 202 set the range value to "medium".

If the temperature is greater than the second (e.g., high) temperature threshold, the mode control circuit 202 set the range value to "high". More or fewer than three predefined ranges may be implemented without departing from the scope of the disclosure. In other examples, the temp signal may provide the range value (e.g., low, medium, high, etc.) directly. The mode control circuit 202 may include logic that provides the mode selection signal having a value based on the range value. For example, the logic of the mode control circuit 202 may look up a selected mode based on the range value. In some examples, the mode control circuit 202 may include programmable elements (e.g., fuses or anti-fuses) that provide temperature range to selected mode programming. For example, based on a value read from the programmable elements, the mode control circuit 202 may read the programmable elements to select a first mode in response the range value having a first value, a second mode in response the range value having a second value, and a third mode in response the range value having a third value. In other examples, based on a value read from the programmable elements, the mode control circuit 202 may select a same mode for more than one or all of the range values. The value programmed into the programmable elements may be based on a VDD voltage magnitude, the VPP voltage requirements, process variations of a semiconductor device (e.g., the semiconductor device 100 of FIG. 1) that includes the multi-mode voltage pump 292, and operational differences caused by temperature changes.

The multi-mode control circuit 204 may receive the selected mode from the mode control circuit 202 via the Mode signal and an oscillator signal OSC. The multi-mode control circuit 204 may include logic to provide control signals to the multi-mode pump circuit 206 in response to timing of the OSC signal and based on the selected mode. The control signal transitions may cause circuitry of the multi-mode pump circuit 206 to operate according to the selecting mode. The multi-mode pump circuit 206 may include multiple stages and may be designed to operate in one of multiple modes. The selected mode may be controlled based on the control signals from the multi-mode control circuit 204. In some examples, the modes may include two stages, a single stage, and a mixed stage mode (e.g., combination of two stages and a single stage).

Figure 3A:
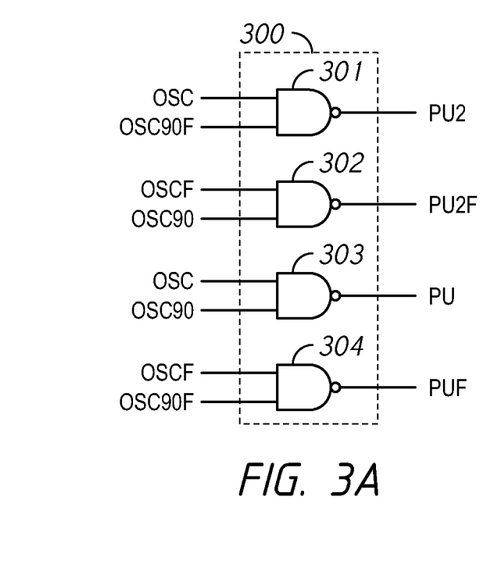
FIGS. 3A-3C are block diagrams of mode control circuity in accordance with an embodiment of the present disclosure.
Figure 3B:
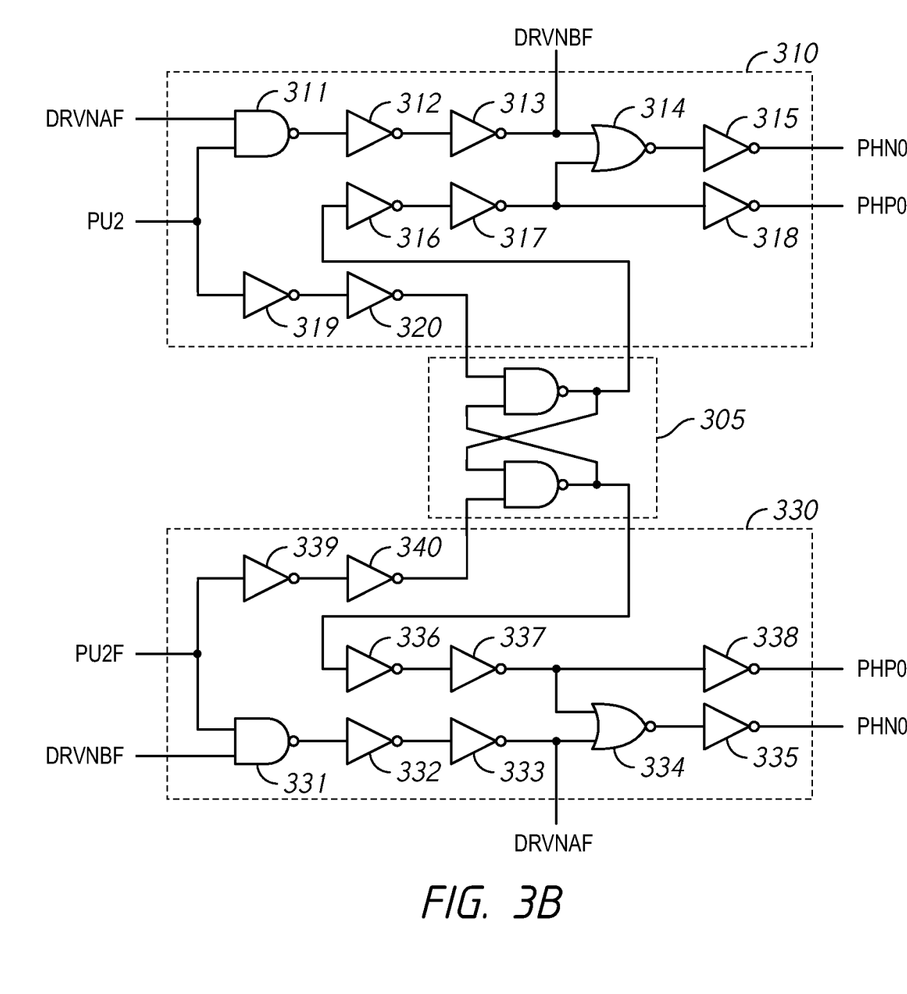
Figure 3C:
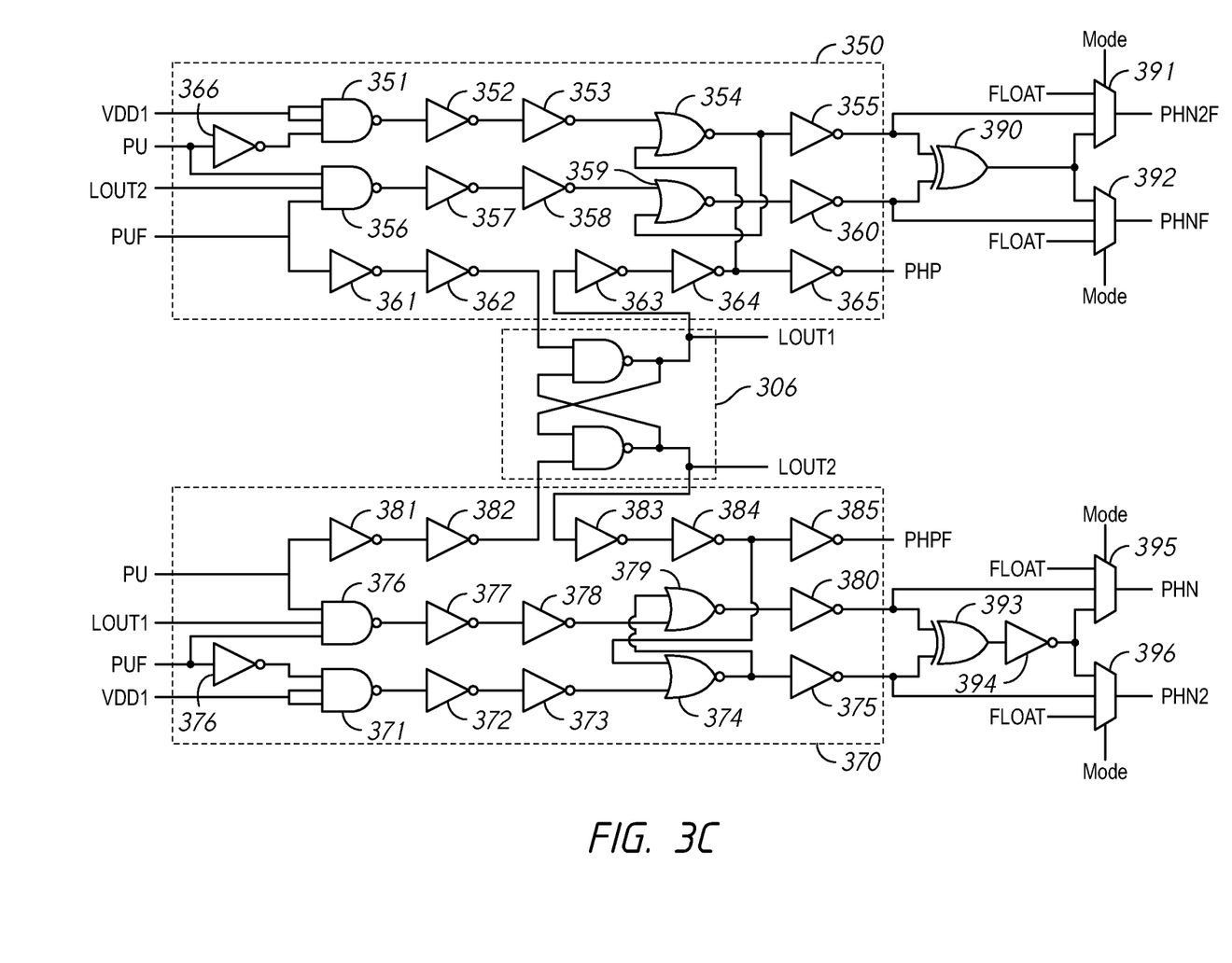

FIGS. 3A-3C are block diagrams of mode control circuity in accordance with an embodiment of the present disclosure. The mode control circuitry of FIGS. 3A-3C may be included in the multi-mode voltage pump 192 of FIG. 1 and/or the multi-mode control circuit 204 of FIG. 2, in some examples. FIG. 3A includes a clock signal logic circuit 300 that is configured to receive oscillator signals (e.g., OSC, OSCF, OSC90, and OSC90F) and to provide clock signals (e.g., PU, PUF, PU2, and PU2F). The value of the OSCF signal is complementary to the value of the OSC signal. The value of the OSC90F signal is complementary to the value of the OSC90 signal. The value of the OSC90 signal is 90 degrees out of phase from the value of the OSC signal. The clock signal logic circuit 300 includes a NAND gate 301 that is configured to provide the PU2 signal based on values of the OSC and OSC90F signals using NAND logic. The clock signal logic circuit 300 further includes a NAND gate 302 that is configured to provide the PU2F signal based on values of the OSCF and OSC90 signals using NAND logic. The clock signal logic circuit 300 further includes a NAND gate 303 that is configured to provide the PU signal based on values of the OSC and OSC90 signals using NAND logic. The clock signal logic circuit 300 further includes a NAND gate 304 that is configured to provide the PUF signal based on values of the OSCF and OSC90F signals using NAND logic.

FIG. 3B includes a first stage control logic circuit 1 310, a first stage control logic circuit 2 330, and a latch circuit 305. The latch circuit 305 may be a latch circuit having outputs controlled based on input signals received from the first stage control logic circuit 1 310 and the first stage control logic circuit 2 330. The circuitry of FIG. 3B is configured to provide control signals PHN0, PHN0F, PHP0, and PHP0F based on values of the PU2 and PU2F signals provided from the clock signal logic circuit 300 of FIG. 3A. The PHN0, PHN0F, PHP0, and PHP0F control signals may be provided to a multi-mode pump circuit, such as the multi-mode pump circuit 206 of FIG. 2. The first stage control logic circuit 1 310 includes first serially-coupled logic circuitry (e.g., a NAND gate 311, an inverter 312, an inverter 313, a NOR gate 314, and an inverter 315), second serially-coupled logic circuitry (e.g., an inverter 316, an inverter 317, and an inverter 318), and third serially-coupled logic circuitry (e.g., an inverter 319 and an inverter 320). The first serially-coupled logic circuitry may be configured to provide the PHN0F signal from the inverter 315 based on the PU2 signal and a first drive signal DRVNAF (e.g., from an output of an inverter 333 of the first stage control logic circuit 2 330) received at an input of the NAND gate 311, and a signal received at the NOR gate 314 from an output of the inverter 317. The second serially-coupled logic circuitry may be configured to provide the PHP0 signal from the inverter 318 based on a first output of the latch circuit 305 received at the inverter 316. The third serially-coupled logic circuitry may be configured to control a first input of the latch circuit 305 based on the PU2 signal received at the inverter 319. The first serially-coupled logic circuitry may be further configured to provide a second drive signal DRVNBF at an output of the inverter 313.

The first stage control logic circuit 2 330 includes fourth serially-coupled logic circuitry (e.g., a NAND gate 331, an inverter 332, an inverter 333, a NOR gate 334, and an inverter 335), fifth serially-coupled logic circuitry (e.g., an inverter 336, an inverter 337, and an inverter 338), and sixth serially-coupled logic circuitry (e.g., an inverter 339 and an inverter 340). The fourth serially-coupled logic circuitry may be configured to provide the PHN0 signal from the inverter 335 based on the PU2F signal and the DRVNBF signal (e.g., from the output of the inverter 313 of the first stage control logic circuit 1 310) received at an input of the NAND gate 331, and a signal received at the NOR gate 334 from an output of the inverter 337. The fifth serially-coupled logic circuitry may be configured to provide the PHP0F signal from the inverter 338 based on a second output of the latch circuit 305 received at the inverter 336. The sixth serially-coupled logic circuitry may be configured to control a second input of the latch circuit 305 based on the PU2F signal received at the 329. The fourth serially-coupled logic circuitry may be further configured to provide the DRVNAF signal at an output of the inverter 333.

FIG. 3C includes a second stage control logic circuit 1 350, a second stage control logic circuit 2 370, and a latch circuit 306. The latch circuit 306 may be a latch circuit having outputs controlled based on input signals received from the second stage control logic circuit 1 350 and the second stage control logic circuit 2 370. The circuitry of FIG. 3C is configured to provide control signals PHP, PHPF, PHN, PHNF, PHP2, PHP2F, PHN2, and PHN2F based on values of the PU and PUF signals provided from the clock signal logic circuit 300 of FIG. 3A. The PHP, PHPF, PHN, PHNF, PHP2, PHP2F, PHN2, and PHN2F control signals may be provided to a multi-mode pump circuit, such as the multi-mode pump circuit 206 of FIG. 2. The second stage control logic circuit 1 350 includes first serially-coupled logic circuitry (e.g., a NAND gate 351 an inverter 352, an inverter 353, a NOR gate 354, and an inverter 355), second serially-coupled logic circuitry (e.g., a NAND gate 356, an inverter 357, an inverter 358, a NOR gate 359, and an inverter 360), third serially-coupled logic circuitry (e.g., an inverter 363, an inverter 364, and an inverter 365), and fourth serially-coupled logic circuitry (e.g., an inverter 361 and an inverter 362). The first serially-coupled logic circuitry may be configured to provide an output signal from the inverter 355 to an XOR gate 390 and a multiplexer 391 based on the PU2 signal inverted via an inverter 366 and a VDD1 voltage received at an input of the NAND gate 351, and a signal received at the NOR gate 354 from an output of the inverter 364. The second serially-coupled logic circuitry may be configured to provide an output signal from the inverter 360 to the XOR gate 390 and a multiplexer 392 based on the PU, PUF, and second output LOUT2 of the latch circuit 306 signals received at the NAND gate 356 and a signal received at the NOR gate 359 from an output of the NOR gate 354. The output of the XOR gate 390 may be provided to the multiplexer 391 and the multiplexer 392 having a value based on the output signal from the inverter 355 and the output signal from the inverter 360. In response to a value of the MODE signal, the multiplexer 391 may be configured to provide one of the output signal from the inverter 355 (e.g., mixed stage mode), the output of the XOR gate 390 (e.g., single stage mode), or a float signal (e.g., two stage mode) at an output as the PHN2F signal. In response to a value of the MODE signal, the multiplexer 392 may be configured to provide one of the output signal from the inverter 360 (e.g., mixed stage mode), the output of the XOR gate 390 (e.g., two stage mode), or a float signal (e.g., single stage mode) at an output as the PHNF signal. The third serially-coupled logic circuitry may be configured to provide the PHP signal based on a first output signal LOUT1 of the latch circuit 306 received at the inverter 363. The fourth serially-coupled logic circuitry may be configured to control a first input of the latch circuit 306 based on the PUF signal received at the inverter 361.

The second stage control logic circuit 2 370 includes fifth serially-coupled logic circuitry (e.g., a NAND gate 371 an inverter 372, an inverter 373, a NOR gate 374, and an inverter 375), sixth serially-coupled logic circuitry (e.g., a NAND gate 376, an inverter 377, an inverter 378, a NOR gate 379, and an inverter 380), seventh serially-coupled logic circuitry (e.g., an inverter 383, an inverter 384, and an inverter 385), and eighth serially-coupled logic circuitry (e.g., an inverter 381 and an inverter 382). The fifth serially-coupled logic circuitry may be configured to provide an output signal from the inverter 375 to an XOR gate 393 and a multiplexer 396 based on the PUF signal inverted via an inverter 386 and a VDD1 voltage received at an input of the NAND gate 371, and a signal received at the NOR gate 374 from an output of the inverter 384. The sixth serially-coupled logic circuitry may be configured to provide an output signal from the inverter 380 to an XOR gate 393 and a multiplexer 395 based on the PU, PUF, and LOUT1 signals received at the NAND gate 376 and a signal received at the NOR gate 379 from an output of the NOR gate 374. The inverted (e.g., via the inverter 394) output of the XOR gate 393 may be provided to the multiplexer 395 and the multiplexer 396 having a value based on the output signal from the inverter 375 and the output signal from the inverter 380. In response to a value of the MODE signal, the multiplexer 395 may be configured to provide one of the output signal from the inverter 380 (e.g., mixed stage mode), the inverted output of the XOR gate 393 (e.g., two stage mode), or a float signal (e.g., single stage mode) at an output as the PHN signal. In response to a value of the MODE signal, the multiplexer 396 may be configured to provide one of the output signal from the inverter 375 (e.g., mixed stage mode), the inverted output of the XOR gate 393 (e.g., single stage mode), or a float signal (e.g., two stage mode) at an output as the PHN2 signal. The seventh serially-coupled logic circuitry may be configured to provide the PHPF signal based on the LOUT2 signal received at the inverter 383. The eighth serially-coupled logic circuitry may be configured to control a second input of the latch circuit 306 based on the PU signal received at the inverter 381.

Figure 4:
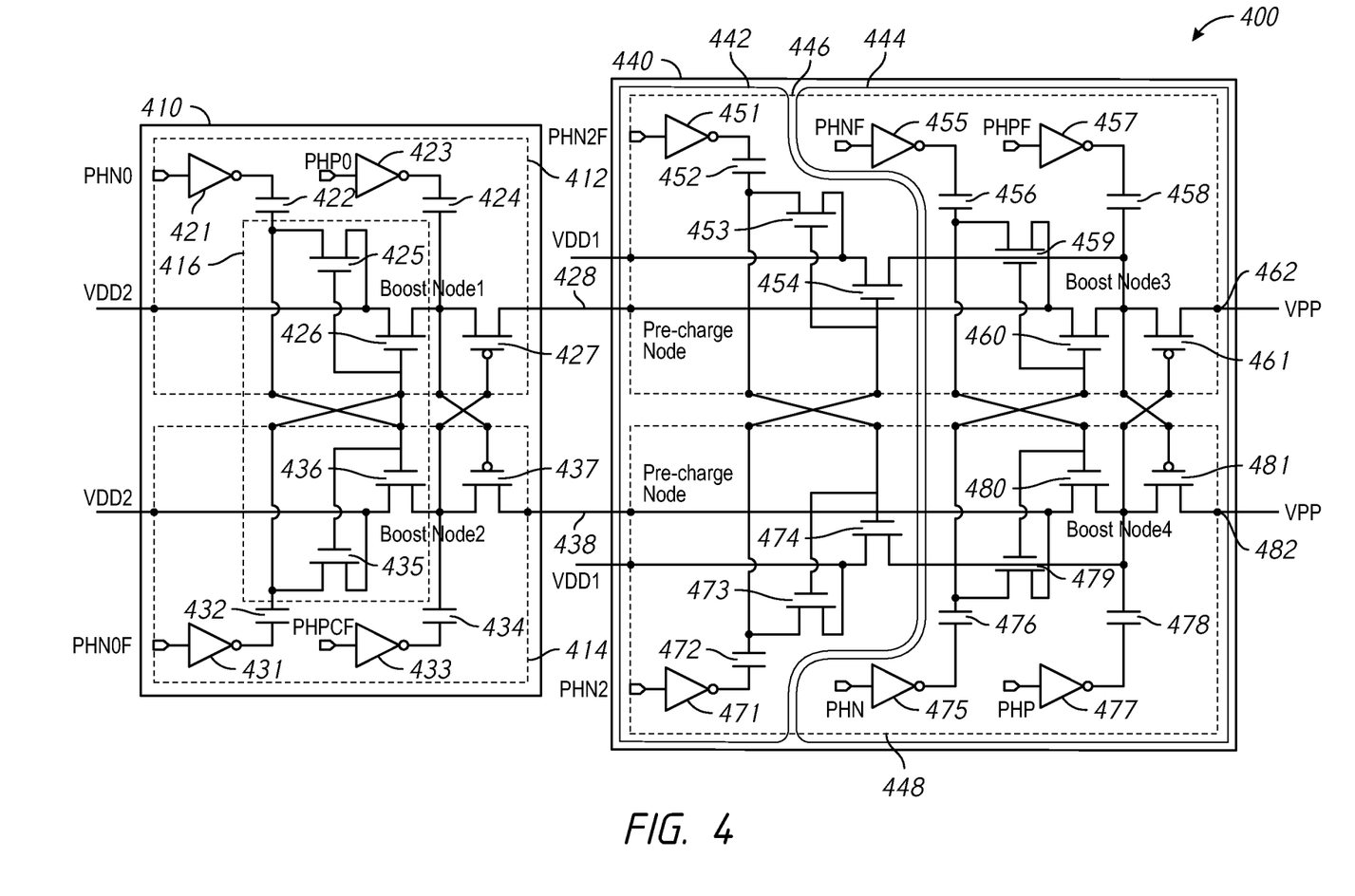
FIG. 4 is a schematic diagram of a multi-mode pump circuit 400 in accordance with an embodiment of the present disclosure.

FIG. 4 is a schematic diagram of a multi-mode pump circuit 400 in accordance with an embodiment of the present disclosure. The multi-mode pump circuit 400 may be included in the multi-mode voltage pump 192 of FIG. 1 and/or the multi-mode pump circuit 206 of FIG. 2, in some examples. The multi-mode pump circuit 400 may be configured to receive the PHP0, PHP0F, PHN0, PHN0F, PHP, PHPF, PHN, PHNF, PHP2, PHP2F, PHN2, and PHN2F control signals from the logic circuits of FIGS. 3B and 3C.

The multi-mode pump circuit 400 may include multiple stages, including a first stage 410 and a second stage 440. The first stage 410 may include an upper portion 412 and a lower portion 414. Based on a VDD2 voltage, the upper portion 412 and the lower portion 414 may be configured to alternatively provide a first precharge voltage from output node 428 and a second precharge voltage from output node 438, respectively, in response to the PHN0 and PHP0 signals and the PHN0F and the PHP0F signals. The upper portion 412 may include first precharge circuitry (e.g., an inverter 421, a capacitor 422, an n-type transistor 425, and an n-type transistor 426) that is configured to control a precharge of a first boost node in response to the PHN0 signal. The upper portion 412 may further include first boost circuitry (e.g., an inverter 423 and a capacitor 424) that is configured to control a pump voltage provided to the first boost node in response to the PHP0 signal and a p-type transistor 427 that is configured to couple the first boost node to the output node 428. The lower portion 414 may include second precharge circuitry (e.g., an inverter 431, a capacitor 432, an n-type transistor 435, and an n-type transistor 436) that is configured to control a precharge of a second boost node in response to the PHN0F signal. The lower portion 414 may further include second boost circuitry (e.g., an inverter 433, a capacitor 434) that is configured to control a pump voltage provided to the second boost node in response to the PHP0F signal and a p-type transistor 437 that is configured to couple the second boost node to the output node 438.

The second stage 440 may include a first circuitry 442 and a second circuitry 444. An upper portion 446 may include a first portion of the first circuitry 442 and a first portion of the second circuitry 444. A lower portion 448 may include a second portion of the first circuitry 442 and a second portion of the second circuitry 444. In a first mode that uses the first circuitry 442 and a portion of the second circuitry 444 (e.g., via the PHN2, PHN2F, PHP, and PHPF signals), based on the VDD1 voltage, the upper portion 446 and the lower portion 448 may be configured to alternatively provide a first pumped voltage from output node 462 and a second pumped voltage from output node 482, respectively, having a value equal to twice the VDD1 voltage in response to the PHN2F and PHPF signals and the PHN2 and PHP signals. In a second mode that uses the first stage 410 and the second circuitry 444 (e.g., via the PHN0, PHN0F, PHP0, PHP0F, PHN, PHNF, PHP, and PHPF signals), based on the precharge voltages from the output nodes 428 and 438, the upper portion 446 and the lower portion 448 may be configured to alternatively provide the first pumped voltage from output node 462 and a second pumped voltage from output node 482, respectively, having a value equal to twice the VDD1 voltage plus the VDD2 voltage in response to the PHN0, PHP0, PHNF and PHPF signals and the PHN0F, PHP0F, PHN, and the PHP signals.

Within the upper portion 446, the first circuitry 442 may include an inverter 451, a capacitor 452, a n-type transistor 453, and a n-type transistor 454 that are configured to control a precharge of a third boost node in response to the PHN2F signal based on the VDD1 voltage. Within the upper portion 446, the second circuitry 444 may include first precharge circuitry (e.g., an inverter 455, a capacitor 456, a n-type transistor 459, and a n-type transistor 460) that is configured to control a precharge of the third boost node in response to the PHNF signal based on the precharge voltage from the output node 428. Within the upper portion 446, the second circuitry 444 may further include first boost circuitry (e.g., an inverter 457 and a capacitor 458) that is configured to control a pump voltage provided to the third boost node in response to the PHPF signal and a p-type transistor 461 that is configured to couple the third boost node to the output node 462. The lower portion 414 may include an inverter 431, a capacitor 432, an n-type transistor 435, and an n-type transistor 436 that are configured to control a precharge of a second boost node in response to the PHN0F signal.

Within the lower portion 448, the first circuitry 442 may include an inverter 471, a capacitor 472, a n-type transistor 473, and a n-type transistor 474 that are configured to control a precharge of a fourth boost node in response to the PHN2 signal based on the VDD1 voltage. Within the lower portion 448, the second circuitry 444 may include second precharge circuitry (e.g., an inverter 475, a capacitor 476, a n-type transistor 479, and a n-type transistor 480) that is configured to control a precharge of the fourth boost node in response to the PHN signal based on the precharge voltage from the output node 438. Within the lower portion 448, the second circuitry 444 may further include second boost circuitry (e.g., an inverter 477 and a capacitor 478) that is configured to control a pump voltage provided to the fourth boost node in response to the PHP signal and a p-type transistor 481 that is configured to couple the fourth boost node to the output node 482.

In operation, the circuitry of FIGS. 3A-3C may provide the control signals (e.g., the PHN0, PHN0F, PHP0, PHP0F, PHN, PHNF, PHN2, PHN2F, PHP, and PHPF signals) according to a selected mode of operation for the multi-mode pump circuit multi-mode pump circuit 400. The multi-mode pump circuit 400 may be configured to operate in the selected mode of operation in response to the control signals. In a first (e.g., single stage) mode, the first pumped voltage from the output node 462 and the second pumped voltage from the output node 482 may be controlled using the first circuitry 442 to precharge the third and fourth boost nodes and the first and second boost circuitry of the second circuitry 444 to boost the third and fourth boost nodes (e.g., excludes the first stage 410 and the first and second precharge circuitry of the second circuitry 444). The first pumped voltage from the output node 462 and the second pumped voltage from the output node 482 may have a magnitude that is the VDD1+VDD1 voltage while operating in the first mode. In some examples, the VDD1 voltage is 1.8 volts.

In a second (e.g., two stage) mode, the first pumped voltage from the output node 462 and the second pumped voltage from the output node 482 may be controlled using the first stage 410 and the first and second precharge circuitry of the second circuitry 444 to precharge the third and fourth boost nodes and the first and second boost circuitry of the second circuitry 444 to boost the third and fourth boost nodes (e.g., excludes the first circuitry 442). The precharge voltage provided from the first stage 410 at the output nodes 428 and 438 may have a magnitude that is the VDD1 voltage added to the VDD2 voltage. The first pumped voltage from the output node 462 and the second pumped voltage from the output node 482 may have a magnitude that is the VDD1+VDD1 voltage plus the VDD2 voltage while operating in the first mode. In some examples, the VDD2 voltage is 1 volt.

In a third (e.g., mixed stage) mode, the first pumped voltage from the output node 462 and the second pumped voltage from the output node 482 may be controlled using a combination of 1) the first circuitry 442 and 2) the first stage 410 and the first and second precharge circuitry of the second circuitry 444 to precharge the third and fourth boost nodes, and the first and second boost circuitry of the second circuitry 444 to boost the third and fourth boost nodes, respectively. For example, during the precharge phase in the second stage 440, the third and fourth boost nodes may be initially precharged via the first circuitry 442 (e.g., for one-quarter of a clock cycle) based on the VDD1 voltage, and then may subsequently precharged via the first and second precharge circuitry of the second circuitry 444 (e.g., for one-quarter of a clock cycle) based on the precharge voltage (e.g., VDD1+VDD2) from the first stage 410. The first pumped voltage from the output node 462 and the second pumped voltage from the output node 482 may have a magnitude that is between the voltage provided in the first mode and the voltage provided while in the second mode.

Figure 5A:
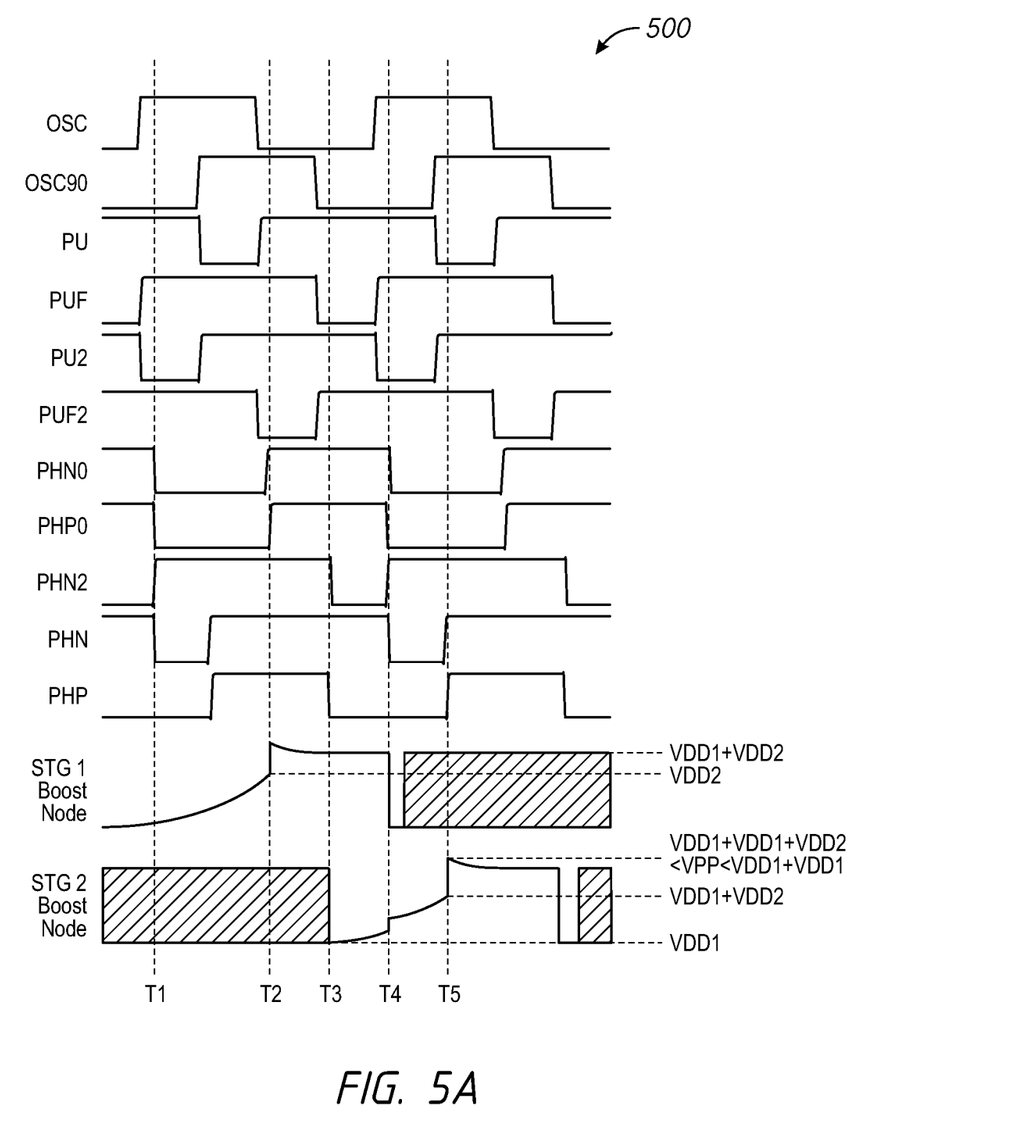
FIGS. 5A-5C are illustrations of an exemplary timing diagrams depicting control signal transition to control a voltage pump in various modes of operation for a multi-mode pump circuit in accordance with embodiments of the present disclosure.
Figure 5B:
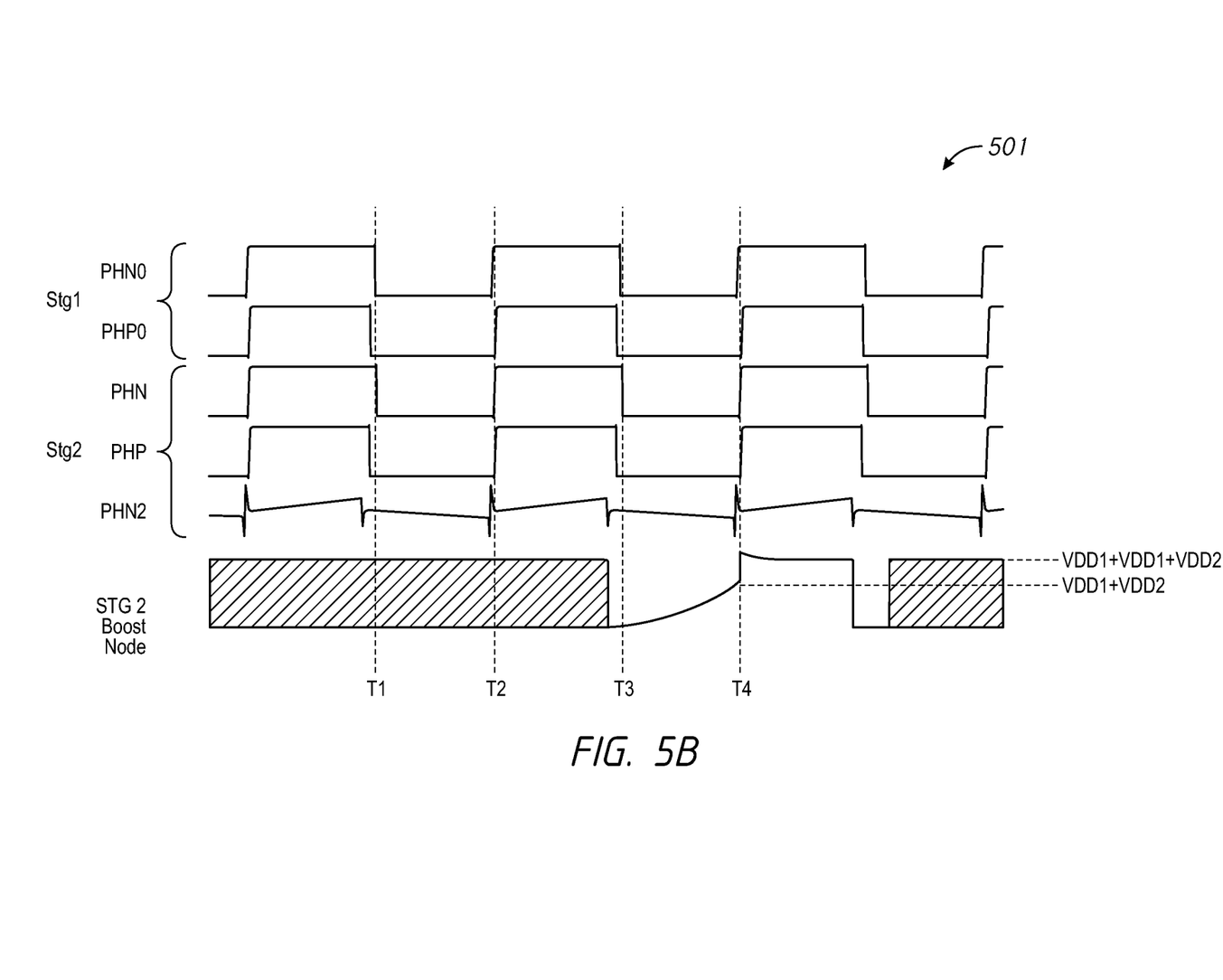
Figure 5C:
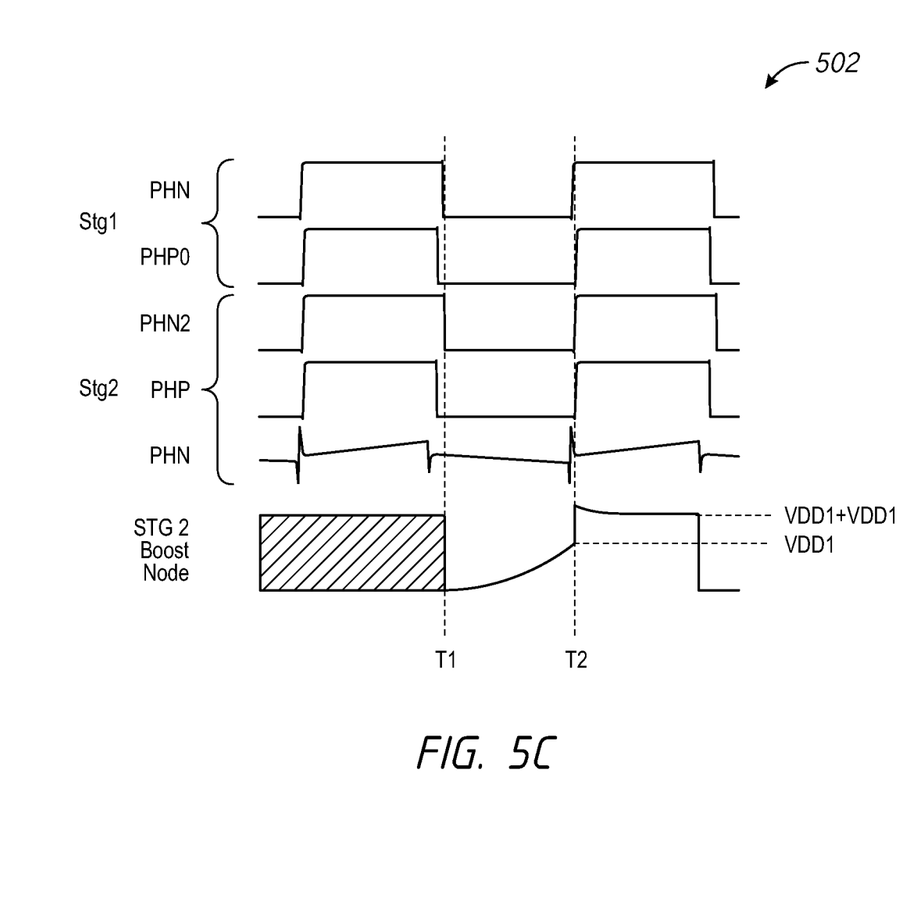

FIGS. 5A-5C are illustrations of exemplary timing diagrams 500, 501, and 502, respectively, depicting control signal transition to control a voltage pump in various modes of operation for a multi-mode pump circuit in accordance with embodiments of the present disclosure. The timing diagrams 500, 501, and 502 may illustrate operation of a multi-mode controller and a multi-mode voltage pump, such as the multi-mode voltage pump 192 of FIG. 1, the multi-mode control circuit 204 and the multi-mode pump circuit 206, respectively, of FIG. 2, the circuitry of FIGS. 3A-3B and the multi-mode pump circuit 400 of FIG. 4, respectively, or combinations thereof. The OSC and OSC90 signals may correspond to the OSC and OSC90 signals of FIG. 3A, respectively. The PU, PUF, PU2, and PU2F signals may correspond to the PU, PUF, PU2, and PU2F signals of FIGS. 3A-3C, respectively. The PHN0, PHP0, PHN2, PHN, and PHP signals may correspond to the PHN0, PHP0, PHN2, PHN, and PHP signals for FIGS. 3B, 3C, and 4, respectively. The Stg1 Boost Node and Stg Boost node signals may correspond to voltages of the Boost Node 1 or Boost Node 2 and Boost Node 3 or Boost Node 4, respectively, of FIG. 4. For clarity, the following discussion of the timing diagrams 500, 501, and 502 may refer to circuitry of FIGS. 3A-3B, and FIG. 4. Specifically, the PU, PUF, PU2, and PU2F signals depicting in the timing diagram 500 may be generated via the clock signal logic circuit 300 of FIG. 3A based on the OSC and OSC90 (e.g., and complement) signals. The PHN0 and PHP0 signals depicted in the timing diagrams 500, 501, and 502 may be generated via the first stage control logic circuit 1 310, the latch circuit 305, and the first stage control logic circuit 2 330 of FIG. 3B. The PHN2, PHN, and PHP signals depicted in the timing diagrams 500, 501, and 502 may be generated via the second stage control logic circuit 1 350, the latch circuit 306, and the second stage control logic circuit 2 370 of FIG. 3C.

The timing diagram 500 of FIG. 5A depicts control signal transition to control a voltage pump in a mixed stage mode of operation for the multi-mode pump circuit. At time T1, the first stage (e.g., the first stage 410) of the multi-mode pump circuit (e.g., the multi-mode pump circuit 400) may begin a precharge operation in response to the PHN0 signal (e.g., controlling the inverter 421 and the capacitor 422, respectively) transitioning to a low logic level. Transition of the PHN0 signal may be based on the clock signal logic circuit 300 of FIG. 3. The precharge operation may include precharging voltage of the Stg1 boost node (e.g., of the first stage 410) to a VDD2 voltage via the capacitor 424.

At time T2, the first stage of the multi-mode pump circuit may begin a boost operation in response to the PHP0 signal transitioning to a high logic level. The boost operation may include charging the voltage of the Stg1 Boost Node to a VDD1+VDD2 voltage via the capacitor 424.

At time T3, a second stage (e.g., the second stage 440) of the multi-mode pump circuit (e.g., the multi-mode pump circuit 400) may begin a first part of a precharge operation in response to the PHN2 signal (e.g., controlling the inverter 471) transitioning to a low logic level. The first part of the precharge operation may include precharging a voltage of the Stg2 Boost Node toward a VDD1 voltage via the capacitor 478.

At time T4, the second stage of the multi-mode pump circuit may begin a second part of a precharge operation in response to the PHN2 signal transitioning to a high logic level and the PHN signal (e.g., controlling the inverter 475) transitioning to a low logic level. The second part of the precharge operation may include precharging the voltage of the Stg2 Boost Node toward the Stg 1 Boost Node voltage (e.g., the VDD1+VDD2 voltage from the output nodes 428 or 438) via the capacitor 478. Each of the first and second parts of the second stage precharge operation may have a duration of one-quarter of a clock cycle of the OSC signal. A final precharge voltage may be between the VDD1 voltage and the VDD1+VDD2 voltage from the first stage.

At time T5, the second stage of the multi-mode pump circuit may begin a boost operation in response to the PHP signal (e.g., controlling the inverter 477) transitioning to a high logic level. The boost operation may include charging the voltage of the Stg2 Boost Node to voltage between the VDD1+VDD1 voltage and the VDD1+VDD1+VDD2 voltage via the capacitor 478.

The timing diagram 501 of FIG. 5B depicts control signal transition to control a voltage pump in a two-stage mode of operation for the multi-mode pump circuit (e.g., the multi-mode pump circuit 400). While in a two-stage mode, a first precharge circuit (e.g., the first circuitry 442) of a second stage (e.g., the second stage 440) may be disabled by disabling the PHN2 signal. At time T1, the first stage (e.g., the first stage 410) of the multi-mode pump circuit may begin a precharge operation in response to the PHN0 signal (e.g., controlling the inverter 421) transitioning to a low logic level. The precharge operation may include precharging the Stg1 Boost Node to a VDD2 voltage via the capacitor 424.

At time T2, the first stage of the multi-mode pump circuit may begin a boost operation in response to the PHP0 signal transitioning to a high logic level. The boost operation may include charging the voltage of the Stg1 Boost Node to a VDD1+VDD2 voltage via the capacitor 424.

At time T3, a second stage (e.g., the second stage 440) of the multi-mode pump circuit may begin a precharge operation in response to the PHN signal (e.g., controlling the inverter 475) transitioning to a low logic level. The precharge operation may include precharging the Stg 1 Boost Node voltage (e.g., the VDD1+VDD2 voltage from the output nodes 428 or 438) via the capacitor 478.

At time T4, the second stage of the multi-mode pump circuit may begin a boost operation in response to the PHP signal (e.g., controlling the inverter 477) transitioning to a high logic level. The boost operation may include charging the voltage of the Stg2 Boost Node to the VDD1+VDD1+VDD2 voltage via the capacitor 478.

The timing diagram 502 of FIG. 5C depicts control signal transition to control a voltage pump in a single-stage mode of operation for the multi-mode pump circuit (e.g., the multi-mode pump circuit 400). While in single-stage mode, the first and second precharge circuitry of a second precharge circuit (e.g., the second circuitry 444) of a second stage (e.g., the second stage 440) may be disabled by disabling the PHN signal. In the single-stage mode, the first stage (e.g., the first stage 410) is also not used. In some examples, the PHN0 and PHP0 signals may also be disabled while in the single-stage mode to reduce power consumption within the multi-mode pump circuit.

At time T1, a second stage (e.g., the second stage 440) of the multi-mode pump circuit may begin a precharge operation in response to the PHN2 signal (e.g., controlling the inverter 471) transitioning to a low logic level. The first part of the precharge operation may include precharging a voltage of the Stg2 Boost Node toward a VDD1 voltage via the capacitor 478.

At time T2, the second stage of the multi-mode pump circuit may begin a boost operation in response to the PHP signal (e.g., controlling the inverter 477) transitioning to a high logic level. The boost operation may include charging the voltage of the Stg2 Boost Node to the VDD1+VDD1 voltage via the capacitor 478.

The timing diagrams 500, 501, and 502 of FIGS. 5A-5C are exemplary for illustrating operation of various described embodiments. Although the timing diagrams 500, 501, and 502 depict a particular arrangement of signal transitions of the included signals, one of skill in the art will appreciate that additional or different transitions may be included in different scenarios without departing from the scope of the disclosure. Further, the depiction of a magnitude of the signals represented in the timing diagrams 500, 501, and 502 are not intended to be to scale, and the representative timing is an illustrative example of a timing characteristics.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
a multi-mode voltage pump configured to provide a pumped voltage, wherein a mode of operation of the multi-mode voltage pump is selected from a plurality of modes each providing a pumped voltage having a different magnitude based on a temperature, wherein the selected mode causes a multistage pump circuit of the multi-mode voltage pump to operate in at least a mixed stage mode of the plurality of modes, and wherein the mixed stage mode uses a mixture of a single stage and two stages to provide the pumped voltage, wherein the multi-mode voltage pump operating in the mixed stage mode provides a pumped voltage having a magnitude between pumped voltages corresponding to those provided using a single stage mode and a two stages mode.

2. The apparatus of claim 1, wherein the selected mode causes the multistage pump circuit of the multi-mode voltage pump to operate in the single stage mode of the plurality of modes.

3. The apparatus of claim 2, wherein the single stage mode uses the single stage to provide the pumped voltage.

4. The apparatus of claim 1, wherein the selected mode causes the multistage pump circuit of the multi-mode voltage pump to operate in the two stage mode of the plurality of modes.

5. The apparatus of claim 4, wherein the two stage mode uses the two stages to provide the pumped voltage.

6. An apparatus comprising:
a multi-mode voltage pump configured to provide a pumped voltage at an output, wherein the multi-mode voltage pump comprises:
a mode control circuit configured to receive a temperature signal and provide a mode signal to select a mode of a plurality of modes based on a value of the temperature signal;
a multi-mode control circuit configured to provide control signals to the multistage pump circuit based on an oscillator signal and the mode signal; and
multistage pump circuit configured to provide the pumped voltage in response to the control signals provided by the multi-mode control circuit; wherein the multistage pump circuit is configured to use a mixture of a single stage and two stages when a mixed stage mode of the plurality of modes is selected by the mode control circuit, wherein a second stage of the two stages comprises one or more additional or alternative circuit elements compared to a first stage of the two stages.

7. The apparatus of claim 6, wherein the multistage pump circuit is configured to operate in one of a single stage mode, a two stage mode, or the mixed stage mode based on the mode of the plurality of modes selected by the mode control circuit, wherein the first stage of the multistage pump circuit is used for the single stage mode, and the first stage and the second stage of the multistage pump circuit are used collectively for the two stage mode.

8. An apparatus comprising:
a multi-mode voltage pump configured to provide a pumped voltage at an output, wherein the multi-mode voltage pump comprises:
a mode control circuit configured to receive a temperature signal and provide a mode signal to select a mode of a plurality of modes based on a value of the temperature signal, wherein, in response to the mode of the plurality of modes selected by the mode control circuit being the mixed stage mode, first circuitry of a stage of the multistage pump circuit is enabled to precharge a boost node of second circuitry of the stage during a first part of the precharge period and disabled during a second part of the precharge period, and wherein a precharge portion of the second circuitry is enabled to precharge the boost node of the second circuitry during the second part of the precharge period and disabled during the first part of the precharge period, wherein, during a boost period following the precharge period, a boost portion of the second circuitry is enabled to charge a voltage of the boost node of the second circuitry to provide the pumped voltage;
a multi-mode control circuit configured to provide control signals to the multistage pump circuit based on an oscillator signal and the mode signal; and
a multistage pump circuit configured to provide the pumped voltage in response to the control signals provided by the multi-mode control circuit, wherein the multistage pump circuit is configured to use a mixture of a first stage individually and the first stage and a second stage collectively when a mixed stage mode of the plurality of modes is selected by the mode control circuit.

9. The apparatus of claim 6, wherein the temperature signal indicates a temperature measurement, a temperature range, or a combination thereof.

10. The apparatus of claim 9, wherein the temperature range comprises a high setting, a medium setting, or a low setting, wherein each setting corresponds to a respective range of temperature values.

11. The apparatus of claim 10, wherein the setting for the respective temperature range is determined during production.

12. The apparatus of claim 6, wherein the mode control circuit comprises a programmable element bank configured to store a value that is based at least in part on a voltage magnitude, one or more voltage requirements, process variations, operational differences due to temperature changes, or a combination thereof.

13. The apparatus of claim 12, wherein the programmable element bank comprises a fuse or anti-fuse bank circuit.

14. The apparatus of claim 12, wherein the mode control circuit is configured to select a same mode for more than one ranges of temperature values based at least in part on the value.

15. The apparatus of claim 12, wherein the multistage pump circuit is configured to operate according to the selected mode from the mode signal based on the control signals.

16. A method, comprising:
receiving a temperature value at a multi-mode voltage pump;
selecting a mode from a plurality of modes based on the temperature value; and
providing a pumped voltage at an output of the multi-mode voltage pump having a magnitude based on the selected mode of the plurality of modes, wherein the pumped voltage is provided using a combination of two stages and a single stage in response to the selected mode being a mixed stage mode, wherein for the mixed stage mode, the magnitude of the pumped voltage is between pumped voltages corresponding to those provided using a single stage mode and a two stages mode.

17. The method of claim 16, further comprising:
providing the pumped voltage using the two stages in response to the selected mode being the two stage mode; and
providing the pumped voltage using the single stage in response to the selected mode being the single stage mode.

18. A method, comprising:
receiving a temperature value at a multi-mode voltage pump;
selecting a mode from a plurality of modes based on the temperature value, wherein, in response to the selected mode being the mixed stage mode:
precharging a boost node of a stage based on a supply voltage via first circuitry of the stage during a first part of a precharge period;
disabling the first circuitry of the stage during a second part of the precharge period;
precharging the boost node of the stage based on a first stage output voltage via second circuitry of the stage during a second part of a precharge period; and
charging the voltage of the boost node to provide the pumped voltage during a boost period following the precharge period; and
providing a pumped voltage at an output of the multi-mode voltage pump having a magnitude based on the selected mode of the plurality of modes, wherein the pumped voltage is provided using a combination of two stages and a single stage in response to the selected mode being a mixed stage mode.

* * * * *